(12) United States Patent
Huang et al.

(10) Patent No.: US 12,193,291 B2
(45) Date of Patent: Jan. 7, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Guobo Yang, Beijing (CN); Jianchang Cai, Beijing (CN); Chao Wu, Beijing (CN); Yuanyou Qiu, Beijing (CN); Binyan Wang, Beijing (CN)

(73) Assignees: CHENGDU BOE OPTELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 433 days.

(21) Appl. No.: 17/771,338

(22) PCT Filed: May 17, 2021

(86) PCT No.: PCT/CN2021/094014
§ 371 (c)(1),
(2) Date: Apr. 22, 2022

(87) PCT Pub. No.: WO2021/244266
PCT Pub. Date: Dec. 9, 2021

(65) Prior Publication Data
US 2022/0376028 A1  Nov. 24, 2022

(30) Foreign Application Priority Data

Jun. 4, 2020  (CN) .......................... 202010498559.7

(51) Int. Cl.
*G09G 3/3233* (2016.01)
*H10K 59/131* (2023.01)
*H10K 59/35* (2023.01)

(52) U.S. Cl.
CPC ......... *H10K 59/131* (2023.02); *H10K 59/351* (2023.02)

(58) Field of Classification Search
CPC .. H10K 59/121; H10K 59/353; H10K 59/131; H10K 59/1213; H10K 59/123
See application file for complete search history.

(56) References Cited

U.S. PATENT DOCUMENTS 11,847,970 B2 * 12/2023 Du ........................ G09G 3/3233
11,863,853 B2 *  1/2024 Ye ........................ H04M 1/0266
(Continued)

FOREIGN PATENT DOCUMENTS

CN   108269840 A    7/2018
CN   108389879 A    8/2018
(Continued)

OTHER PUBLICATIONS

Chinese Office Action dated Jun. 22, 2024, cited in Chinese Application No. 202010498559.7, 13 pages.

*Primary Examiner* — Anthony Ho
*Assistant Examiner* — David J Goodwin
(74) *Attorney, Agent, or Firm* — Leason Ellis LLP

(57) ABSTRACT

A display substrate and a display device. The present display substrate includes a first to a third display region. The first display region includes first pixel repeating units, and allows light from the first side to at least partially penetrate to the second side. The second display region includes second and fourth pixel repeating units. The third display region includes third pixel repeating units. Each first pixel repeating unit is electrically connected to the corresponding fourth (Continued)

pixel repeating unit by means of t transparent connecting traces. The pitch of the first and second pixel repeating units is b1, and the pitch of the third pixel repeating units is b2, the pitch of the transparent connecting traces is D, and the maximum number s of first pixel repeating units in the first direction satisfying $s \leq 2*\text{Floor}(b1/((D*t)))$.

20 Claims, 5 Drawing Sheets

(56) References Cited

U.S. PATENT DOCUMENTS

| | | | |
|---|---|---|---|
| 11,985,853 B2* | 5/2024 | Ko | H10K 59/121 |
| 2017/0195658 A1 | 7/2017 | Jung | |
| 2018/0089485 A1 | 3/2018 | Bok | |
| 2019/0131371 A1* | 5/2019 | Yi | H10K 59/124 |
| 2019/0326366 A1 | 10/2019 | Fan et al. | |
| 2021/0066409 A1* | 3/2021 | Fan | H10K 59/121 |

FOREIGN PATENT DOCUMENTS

| | | |
|---|---|---|
| CN | 110491918 A | 11/2019 |
| CN | 110504289 A | 11/2019 |
| CN | 110783384 A | 2/2020 |
| CN | 110890026 A | 3/2020 |
| CN | 111048005 A | 4/2020 |

\* cited by examiner

DISPLAY SUBSTRATE AND DISPLAY DEVICE

CROSS-REFERENCE TO RELATED PATENT APPLICATIONS

This application is a U.S. National Phase Entry of International Application No. PCT/CN2021/094014 filed on May 17, 2021, which claims priority to the Chinese patent application No. 202010498559.7, filed Jun. 4, 2020, both of which are incorporated herein by reference as part of the present application. The International Application was published on Dec. 9, 2021, as International Publication No. WO/2021/244266 A1.

TECHNICAL FIELD

The embodiments of the present disclosure relate to a display substrate and a display device.

BACKGROUND

With the development of display electronic products such as mobile phones, the increase of the screen-to-body ratio of the display screen has become a product trend. The necessary functional components (such as front camera, etc.) of mobile phones have become a major factor that restricting the increase of the screen-to-body ratio. Regarding this issue, the industry has proposed a scheme called "under-display camera" which integrates the camera and the display substrate into a display device. In such a scheme, the display device includes a display substrate and a camera located below the display substrate. The region having an under-display camera of the display device may emit light and display like other regions, and have a camera function at the same time.

SUMMARY

At least one embodiment of the disclosure provides a display substrate, having a first side for display and a second side opposite to the first side, and comprising a first display region, a second display region and a third display region; wherein the first display region comprises a plurality of first pixel repeating units arranged in an array along a first direction and a second direction, each of the plurality of first pixel repeating units comprises a first light-emitting element, and the first display region comprises a light-transmitting region that allows a light to be transmitted between the first side and the second side of the display substrate; the second display region comprises a plurality of second pixel repeating units and a plurality of fourth pixel repeating units that are arranged as an array along the first direction and the second direction, each of the plurality of second pixel repeating units comprises a second pixel circuit and a second light-emitting element, the second pixel circuit is electrically connected to the second light-emitting element, and each of the fourth pixel repeating units comprises a first pixel circuit; the third display region comprises a plurality of third pixel repeating units arranged as an array along the first direction and the second direction, each of the plurality of third pixel repeating units comprises a third pixel circuit and a third light-emitting element, and the third pixel circuit is electrically connected to the third light-emitting element; the third display region at least partially surrounds the second display region, the second display region at least partially surrounds the first display region, and the second display region is axisymmetric with respect to a centerline of the first display region in the second direction; each of the plurality of first pixel repeating units corresponds to one of the plurality of fourth pixel repeating units, and a connection line of centers of each of the plurality of first pixel repeating units and a corresponding one of the plurality of fourth pixel repeating units is substantially parallel to the first direction, the first light-emitting element in each of the plurality of first pixel repeating units is electrically connected to the first pixel circuit in the corresponding one of the plurality of the fourth pixel repeating units through a transparent connection wire with a number of t, t is a positive integer and $t \geq 1$; a pitch of the plurality of first pixel repeating units in the second direction is $b_1$, a pitch of the plurality of second pixel repeating units in the second direction is $b_1$, and a pitch of the plurality of third pixel repeating units in the second direction is $b_2$, wherein, $b_1 = n \ast b_2$, n is a positive integer and $n \geq 2$; wherein a pitch of the transparent connection wires in the second direction is D, and a maximum number s of the plurality of first pixel repeating units included in the first display region in the first direction satisfies: $s \leq 2 \ast \mathrm{Floor}(b_1/((D \ast t)))$, where Floor ( ) represents a round down function.

For example, in the display substrate provided in some embodiments of the disclosure, a pitch of the plurality of first pixel repeating units in the first direction is $a_1$, a pitch of the plurality of second pixel repeating units in the first direction is $a_1$, and a pitch of the plurality of third pixel repeating units in the first direction is $a_2$, wherein $a_1 = m \ast a_2$, m is a positive integer and $m \geq 2$, a dimension L1 of the first display region in the first direction substantially satisfies: $L_1 = s \ast a_1$.

For example, in the display substrate provided in some embodiments of the disclosure, a dimension of the first display region in the second direction is substantially equal to a dimension of the first display region in the first direction.

For example, in the display substrate provided in some embodiments of the disclosure, the first display region comprises a circular display region and a ring-shaped wire region surrounding the circular display region; a gating line for driving the first light emitting element in each row of the plurality of first pixel repeating units in the first direction is electrically connected to the first pixel circuit in a corresponding same row of the plurality of fourth pixel repeating units in the first direction, and at least a portion of the gating line extends along the first direction, at least another portion of the gating line is located in the ring-shaped wire region, and the gating line does not extend through the circular display region; a data line for driving the first light-emitting element in each column of the plurality of first pixel repeating units in the second direction is electrically connected to the first pixel circuit in a corresponding column of the plurality of fourth pixel repeating units in the second direction, and at least a portion of the data line extends along the second direction, at least another portion of the data line is located within the ring-shaped wire region, the data line does not extend through the circular display region; the gating line and the data line are located in different layers.

For example, in the display substrate provided in some embodiments of the disclosure, a number of a gating line corresponding to each of the plurality of third pixel repeating units is the same as a number of the gating line corresponding to each of the plurality of first pixel repeating units, the number of the gating line corresponding to each of the plurality of first pixel repeating units is x, and a pitch of the gating line in the ring-shaped wire region is $c_1$, a total radial width of the gating line in the ring-shaped wire region is approximately $x \ast c_1 \ast \mathrm{Floor}(L_1/b_2)/2$; a number of the data line corresponding to each of the plurality of first pixel repeating units is y, a pitch of the data line in the ring-shaped wire region is c2, and a total radial width of the data line in the ring-shaped wire region is approximately y*c2*s/2.

For example, in the display substrate provided in some embodiments of the disclosure, an orthogonal projection of a body part of the gating line on the display substrate is not overlapped with an orthogonal projection of a body part of the data line on the display substrate, wherein the body part of the gating line extends along circumference in the ring-shaped wire region, and the body part of the data line extends along circumference in the ring-shaped wire region, a radial width of the ring-shaped wire region is approximately x*c1*Floor (L1/b2)/2+y*c2*s/2.

For example, in the display substrate provided in some embodiments of the disclosure, a diameter of the circular display region is approximately s*a1−x*c1*Floor(L1/b2)−y*c2*s/2.

For example, in the display substrate provided in some embodiments of the disclosure, an orthogonal projection of a body part of the gating line on the display substrate is at least partially overlapped with an orthogonal projection of a body part of the data line on the display substrate, wherein the body part of the gating line extends along circumference in the ring-shaped wire region, and the body part of the data line extends along circumference in the ring-shaped wire region, a radial width of the ring-shaped wire region is approximately max (x*c1*Floor (L1/b2)/2, y*c2*s/2), wherein max ( ) is a function taking a maximum value.

For example, in the display substrate provided in some embodiments of the disclosure, a diameter of the circular display region is approximately s*a1−max(x*c1*Floor(L1/b2), y*c2*s).

For example, in the display substrate provided in some embodiments of the disclosure, a dimension L2 of the second display region in the first direction substantially satisfies: L2=(s+2)*a1.

For example, in the display substrate provided in some embodiments of the disclosure, a dimension of the second display region in the second direction is substantially equal to a dimension of the first display region in the second direction.

For example, in the display substrate provided in some embodiments of the disclosure, a dimension of the second display region in the second direction is greater than a dimension of the first display region in the second direction, and a difference between the dimension of the second display region in the second direction and the dimension of the first display region in the second direction is substantially equal to 4b1.

For example, in the display substrate provided in some embodiments of the disclosure, a pitch of the plurality of fourth pixel repeating units in the first direction is equal to a pitch of the plurality of second pixel repeating units in the first direction.

For example, in the display substrate provided in some embodiments of the disclosure, each of the plurality of first pixel repeating units comprises eight first light-emitting elements arranged according to a GGRB pixel arrangement, t=8, a number of gating lines corresponding to each of the plurality of first pixel repeating units is 4, and a number of data lines corresponding to each of the plurality of first pixel repeating units is 4.

For example, in the display substrate provided in some embodiments of the disclosure, each of the plurality of first pixel repeating units comprises twelve first light-emitting elements arranged according to a RGB pixel arrangement, t=12, a number of gating lines corresponding to each of the plurality of first pixel repeating units is 2, and a number of data lines corresponding to each of the plurality of first pixel repeating units is 6.

For example, in the display substrate provided in some embodiments of the disclosure, the first direction and the second direction are perpendicular to each other.

For example, in the display substrate provided in some embodiments of the disclosure, the display substrate comprises an anode layer, a source/drain electrode layer and a transparent connection wire layer between the anode layer and the source/drain electrode layer, an anode of the first light-emitting element is located in the anode layer, and the transparent connection wire is located in the transparent connection wire layer, the first pixel circuit comprises a thin film transistor, the thin film transistor comprises a source and a drain, and at least one of the source and the drain of the thin film transistor is located in the source/drain metal layer, the anode of the first light-emitting element is electrically connected to at least one of the source and the drain of the thin film transistor through the transparent connection wire.

For example, in the display substrate provided in some embodiments of the disclosure, an anode of the first light-emitting element is a transparent electrode.

At least one embodiment of the disclosure provides a display device, comprising the display substrate according to any embodiments of the disclosure.

For example, the display device provided in some embodiments of the disclosure further comprises a sensor, wherein the sensor is disposed on the second side of the display substrate, an orthogonal projection of the sensor on the display substrate is at least partially overlapped with the first display region, and the sensor is configured for receiving a light from the first side.

BRIEF DESCRIPTION OF THE DRAWINGS

In order to more clearly illustrate the technical schemes of the embodiments of the present disclosure, the accompanying drawings of the embodiments will be briefly introduced as below. It is obvious that the accompanying drawings in the following description only relate to some embodiments of the present disclosure, and are not intended to limit the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed. In order to keep the following description of embodiments of the disclosure clear and concise, the disclosure omits a detailed description of some of the known functions and known components.

In the design scheme of "under-display camera", in order to make more light enter the camera located below the display substrate, the display substrate may be designed with a high pixel density region and a low pixel density region, and the camera is disposed below the low pixel density region that allows more light to pass through.

Figure 1A:
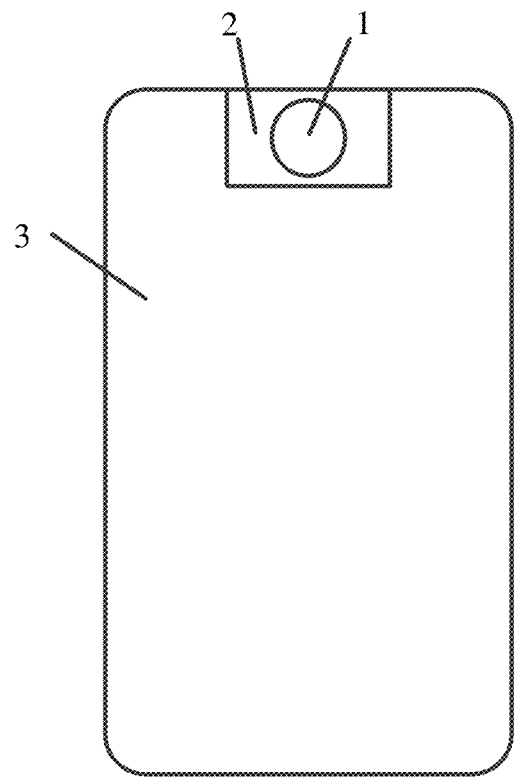
FIG. 1A is a schematic plan view of a display substrate.
Figure 1B:
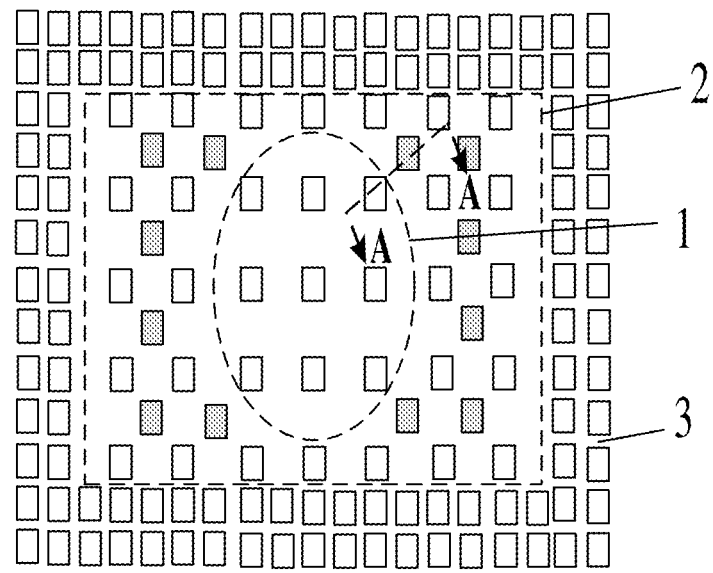
FIG. 1B is a partially enlarged schematic view of a display substrate.
Figure 2:
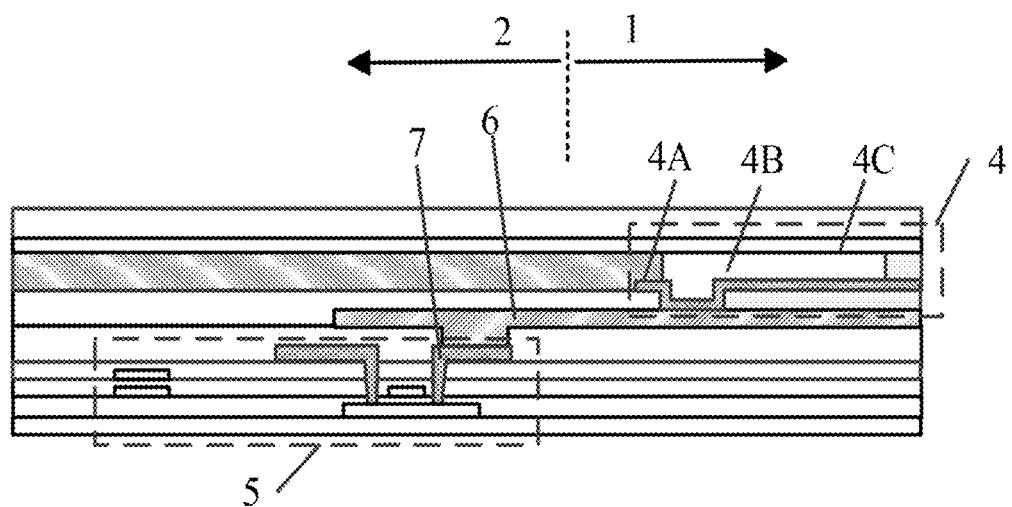
FIG. 2 is a schematic cross-sectional view of the display substrate taken along A-A line of FIG. 1B.

For example, FIG. 1A illustrates a schematic plan view of a display substrate, FIG. 1B is a partially enlarged schematic view of the display substrate shown in FIG. 1A, and FIG. 2 illustrates a schematic cross-sectional view of the display substrate taken along A-A line of FIG. 1B. As shown in FIG. 1A, FIG. 1B and FIG. 2, the display region of the display substrate includes a light-transmitting display region 1, a transition display region 2 and a main display region 3.

For example, the main display region 3 is a primary display region that has a high resolution (PPI, pixel per inch), that is, a higher density of sub-pixels for display are arranged within the main display region 3. Each sub-pixel includes a light-emitting element and a pixel circuit driving the light-emitting element. The light-transmitting display region 1 may allow the light emitted from the display side of the display substrate to transmit through the display substrate and reach the back side of the display substrate, and thus be used for the normal work of components (such as, sensors) located on the back side of the display substrate. Of course, the light-transmitting display region 1 may also allow the light emitted from the back side of the display substrate to transmit through the display substrate, and reach the display side of the substrate. The light-transmitting display region 1 and the transition display region 2 also include a plurality of sub-pixels for display. However, since the pixel circuits of the sub-pixels are generally opaque, the light-emitting elements of the sub-pixels of the light transmitting display region 1 may be physically separated from the pixel circuits driving the light-emitting elements, so as to improve the light transmittance of the light-transmitting display region 1. For example, the pixel circuits (e.g., shown as the gray boxes in the transition display region 2) of the sub-pixels (e.g., shown as the boxes in the light-transmitting display region 1 in FIG. 1B) in the light-transmitting display region 1 may be disposed in the transition display region 2, and thus occupy a part of the space of the transition display region 2; while the remaining space of the transition display region 2 is used for disposing the sub-pixels of the transition display region 2. For example, each white box in the transition display region 2 represents one sub-pixel. In this case, the sub-pixels (the white boxes in FIG. 1B) in the transition display region 2 and the pixel circuits (the gray boxes in FIG. 1B) of the sub-pixels of the light-transmitting display region 1 are arranged as an array in the transition display region 2. As such, the resolutions of the light-transmitting display region 1 and the transition display region 2 are lower than the resolution of the main display region 3, that is, the density of the sub pixels for display arranged in the light-transmitting display region 1 and the transition display region 2 is less than the density of the sub-pixels in the main display region 3.

As shown in FIG. 2, a light-emitting element 4 of a sub-pixel in the light-transmitting display region 1 includes an anode 4A, a cathode 4C and a light-emitting layer 4B disposed between the anode 4A and the cathode 4C. The anode 4A is connected to the pixel circuit 5 in the transition display region 2 through a wire 6. For example, the pixel circuit 5 includes structures such as a thin film transistor (T), a capacitor (c) and the like. For example, the pixel circuit 5 may be implemented as a common pixel driving circuit, such as 2T1C, 4T1C, 4T2C, 7T1C or the like.

In order to improve the light transmittance of the light-transmitting display region 1, the above-described wire 6 is generally a transparent connection wire, alternatively, at least a portion of the wire 6 located in the light-transmitting display region 1 is transparent (in this case, even if the remaining portions of the wire 6 is opaque, the wire 6 may be considered as a transparent connection wire in the present disclosure). For example, the transparent connection wire may use transparent conductive materials such as transparent metal oxides (e.g., indium tin oxide (ITO), etc.), so as to have a good light transmittance. It should be noted that, throughout the present disclosure, "transparent", "light-transmitting" merely require a certain light transmittance, for example, the light transmittance is greater than 0, and the light transmittance is not required to be 100%. For example, generally, if the light transmittance of any structure or region is greater than a certain value (e.g., 40%, 45%, 50%, etc.), the structure or the region may be considered as "transparent" and "light-transmitting".

In the actual process, the minimum width of the wire 6 is limited (e.g., 1.5 μm-2.5 μm); when a plurality of wires 6 are densely arranged, the minimum spacing between the adjacent wires 6 is also limited (e.g., 1.5 μm-2.5 μm); as such, the pitch of the wires 6 is also limited (e.g., 3 μm-5 μm). Due to the limitation of the pitch of the wires 6, the dimension and the size of the light-transmitting display region 1 and the resolution of the light-transmitting display region 1 are restricted by each other. It should be noted that, in the present disclosure, "pitch" refers to the distance between centers of adjacent similar structures.

At least one embodiment of the present disclosure provides a display substrate. The display substrate has a first side for display and a second side opposite to the first side, and the display substrate includes a first display region, a second display region and a third display region. The first display region includes a plurality of first pixel repeating units arranged as an array along a first direction and a second direction. Each first pixel repeating unit includes a first light-emitting element, and the first display region includes a light-transmitting region that allows light to be transmitted between the first side and the second side of the display substrate; the second display region includes a plurality of second pixel repeating units and a plurality of fourth pixel repeating units arranged as an array along the first direction and the second direction, each second pixel repeating unit includes a second pixel circuit and a second light-emitting element, the second pixel circuit and the second light-emitting element are electrically connected to each other, and each fourth pixel repeating unit includes a first pixel circuit; the third display region includes a plurality of third pixel repeating units arranged as an array along the first direction and the second direction, each third pixel repeating unit includes a third pixel circuit and a third light-emitting element, and the third pixel circuit is electrically connected to the third light-emitting element; the third display region at least partially surrounds the second display region, the second display region at least partially surrounds the first display region, and the second display region is axisymmetric with respect to the centerline of the first display region in the second direction. Each first pixel repeating unit corresponds to one fourth pixel repeating unit, the connection line of the centers of each first pixel repeating unit and the corresponding fourth pixel repeating unit is substantially parallel with the first direction, and the first light-emitting element in each first pixel repeating unit is electrically connected to the first pixel circuit in the corresponding fourth pixel repeating unit through t transparent connection wires, t is a positive integer and t≥1; the pitch of the first pixel repeating units in the second direction is b1, the pitch of the second pixel repeating units in the second direction is b1, and the pitch of the third pixel repeating units in the second direction is b2, wherein b1=n*b2, n is a positive integer and n≥2; the pitch of the transparent connection wires in the second direction is D, and the maximum number s of the first pixel repeating units included in the first display region along the first direction satisfies: s≤2*Floor (b1/((D*t))), wherein Floor ( ) represents the round down function.

Some embodiments of the present disclosure also provide a display device corresponding to the above-described display substrate.

The display substrate provided by the embodiments of the present disclosure may optimize the layout of the transparent connection wires and the layout of the first light-emitting elements in the first display region, thereby improving the display effect of the first display region and improving the light transmittance of the first display region, which is helpful to improve the performance of the full screen display device.

Some embodiments and examples of the present disclosure are described in detail as below in combination with the accompanying drawings. It should be understood that, the specific embodiments described herein are merely used for illustrating and explaining the present disclosure, and are not intended to limit the present disclosure.

Figure 3:
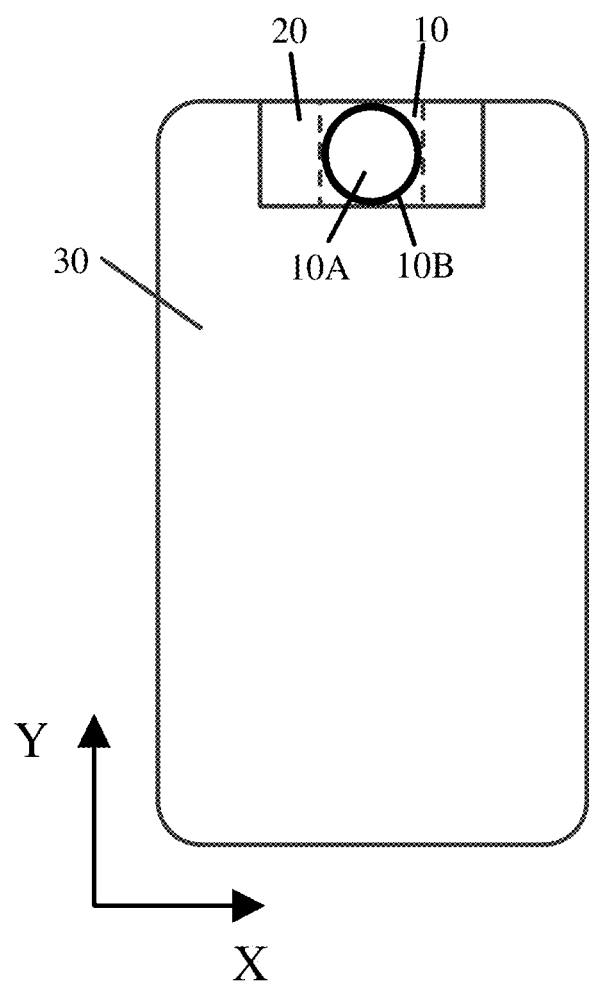
FIG. 3 is a schematic plan view of a display substrate provided by at least one embodiment of the present disclosure.

At least one embodiment of the present disclosure provides a display substrate, and FIG. 3 illustrates a schematic plan view of the display substrate. As shown in FIG. 3, the display substrate has a first side for display (i.e., a display side) and a second side (i.e., a non-display side) opposite to the first side. The display substrate includes a display region, and the display region includes a first display region 10 (designated by a dotted box), a second display region 20 and a third display region 30.

For example, as shown in FIG. 3, the third display region at least partially surrounds the second display region 20, the second display region 20 at least partially surrounds the first display region 10, and the second display region 20 is axisymmetric with respect to the centerline of the first display region 10 in the second direction Y. For example, as shown in FIG. 3, the second display region 20 is symmetrically distributed on two sides of the first display region 10 in the first direction X, for example, the first direction X and the second direction Y are perpendicular to each other, which is included in the embodiments of the disclosure, but the embodiments of the present disclosure is not limited thereto.

For example, as shown in FIG. 3, the first display region 10 may include a circular display region 10A and a ring-shaped wire region 10B surrounding the circular display region 10A. In FIG. 3, the ring-shaped wire region 10B is designated by a black ring, and the circular display region 10A is designated by a white circle in the ring-shaped wire region 10B. For example, the first display region 10 allows the light from the first side to be at least partially transmitted to the second side; for example, in some embodiments, at least the circular display region 10A allows the light from the first side to be at least partially transmitted to the second side, that is, at least the circular display region 10A is a transparent display region, and the light may transmit from the display side of the display substrate, pass through the transparent display region, and reach the non-display side. The non-display side may be disposed with sensors, such as, cameras, infrared sensing devices, or the like, and the sensors may operate using the light transmitted to the non-display side. In some embodiments, it may also be disposed such that the light emitted from the devices on the non-display side of the display substrate transmit to the display side of the display substrate through a transparent display region (e.g., the circular display region 10A).

Figure 4:
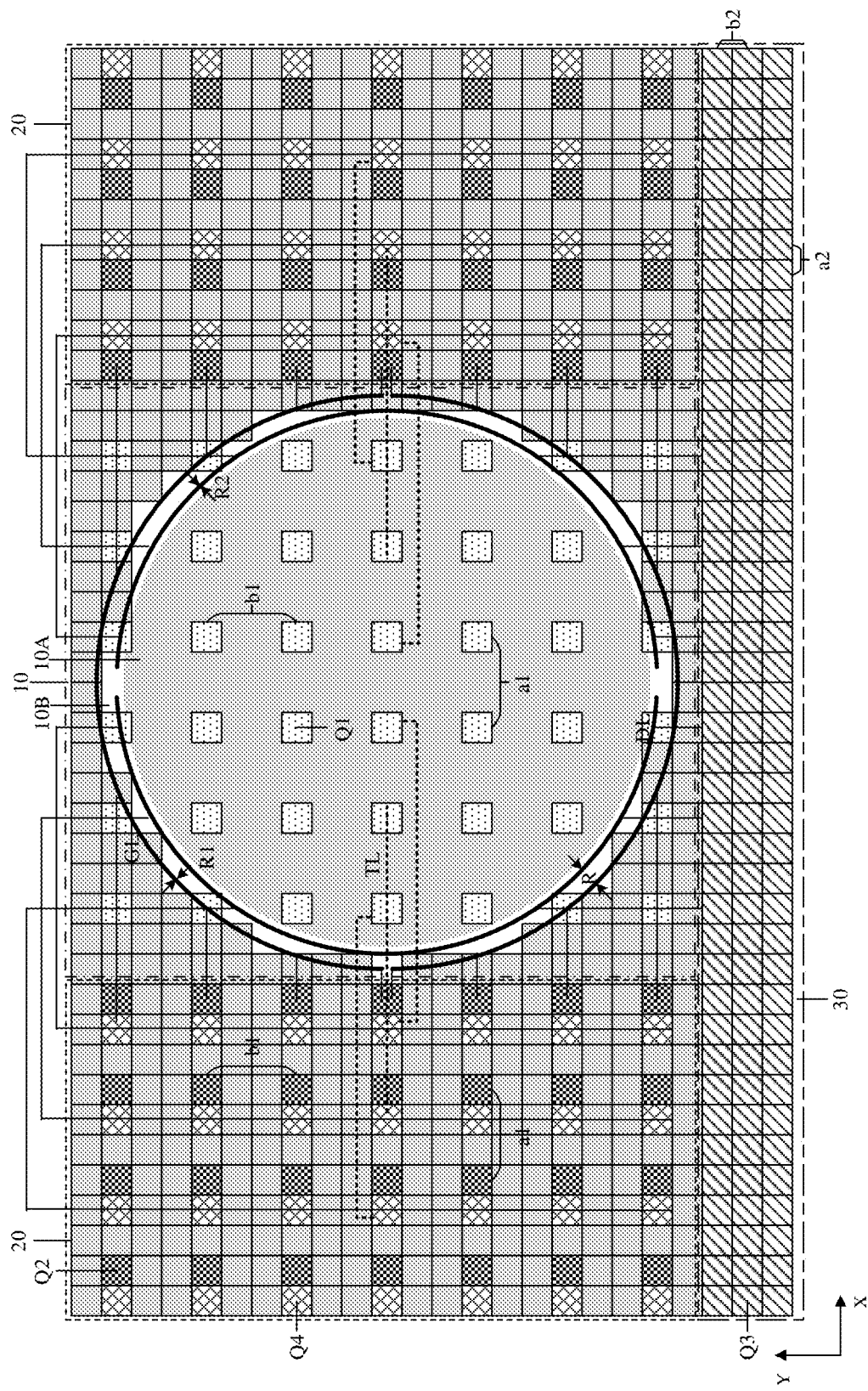
FIG. 4 is a partially enlarged schematic view of a display substrate provided by at least one embodiment of the present disclosure.

FIG. 4 is a partially enlarged schematic view of the display substrate shown in FIG. 3. For example, as shown in FIG. 4, the first display region 10 includes a plurality of first pixel repeating units Q1 arranged as an array along the first direction X and the second direction Y, the second display region 20 includes a plurality of second pixel repeating units Q2 and a plurality of fourth pixel repeating units Q4 arranged as an array along the first direction X and the second direction Y, and the third display region 30 includes a plurality of third pixel repeating units Q3 arrayed as an array along the first direction X and the second direction Y.

For example, the first pixel repeating unit Q1 includes a first light-emitting element and does not include a first pixel circuit for driving the first light-emitting element. For example, there is free of pixel circuit in the first display region 10, and the first pixel circuits for driving the first light-emitting elements are disposed in the second display region 20, such that the metal coverage area in the first display region 10 may be reduced and the light transmittance of the first display region 10 may be enhanced.

For example, the second pixel repeating unit Q2 includes a second pixel circuit and a second light-emitting element, the second pixel circuit is electrically connected to the second light-emitting element, and the second pixel circuit is used for driving the second light-emitting element. For example, in some examples, the second pixel circuit(s) and the second light-emitting element(s) in each pixel repeating unit Q2 have a one-to-one correspondence relation. It should be noted that, the specific numbers of the second pixel circuits and the second light-emitting elements included in each pixel repeating unit Q2 are not limited by the embodiments of the present disclosure.

For example, the third pixel repeating unit Q3 includes a third pixel circuit and a third light-emitting element, the third pixel circuit is electrically connected to the third light-emitting element, and the third pixel circuit is used for driving the third light-emitting element. For example, in some examples, the third pixel circuit(s) and the third light-emitting element(s) in each pixel repeating unit Q3 have a one-to-one correspondence relation. It should be noted that, the specific numbers of the third pixel circuits and the third light-emitting elements included in each pixel repeating unit Q3 are not limited by the embodiments of the present disclosure.

For example, the fourth pixel repeating units Q4 include first pixel circuits for driving the first light-emitting elements. For example, each first pixel repeating unit Q1 corresponds to one fourth pixel repeating unit Q4, and the connection line of the centers of each first pixel repeating unit Q1 and the corresponding fourth pixel repeating unit Q4 is substantially parallel to the first direction X, that is, the light-emitting elements in the first pixel repeating units Q1 in each row along the first direction X are driven by the first pixel circuits in the fourth pixel repeating units in the same row along the first direction X.

For example, as shown in FIG. 4, the first light-emitting element(s) in each first pixel repeating unit Q1 is/are electrically connected to the first pixel circuit(s) in the corresponding fourth pixel repeating unit Q4 through t transparent connection wire(s) TL, t is a positive integer and t≥1. For example, the number of the first light-emitting element(s) in each first pixel repeating unit Q1 is t, and the number of first pixel circuit(s) in the corresponding fourth pixel repeating unit Q4 is also t, such that each first light-emitting element is electrically connected to a corresponding one first pixel circuit through one transparent connection wire TL. For the sake of convenience and brevity, the above-described t transparent connection wire(s) TL are designated by a dotted line.

For example, as shown in FIG. 4, the first pixel repeating units Q1 in the first display region 10 are evenly arranged, such that the first display region 10 may realize uniform light emission and display. For example, as shown in FIG. 4, the pitch of the first pixel repeating units Q1 in the first direction X is a1, and the pitch of the first pixel repeating units Q1 in the second direction Y is b1.

For example, as shown in FIG. 4, the second pixel repeating units Q2 in the second display region 20 are evenly arranged, such that the second display region 20 may realize uniform light emission and display. For example, as shown in FIG. 4, the pitch of the second pixel repeating units Q2 in the first direction X is a1, and the pitch of the second pixel repeating units Q2 in the second direction Y is b1, that is, in general, the first pixel repeating units Q1 and the second pixel repeating units Q2 are evenly arranged in the first display region 10 and the second display region 20, thereby realizing the overall uniform light emission and display of the first display region 10 and the second display region 20.

For example, in some examples, as shown in FIG. 4, the fourth pixel repeating units Q4 in the second display region 20 are evenly arranged, thereby optimizing the arrangement of the wires (including the transparent connection wires TL and subsequent gating lines GL and data lines DL, etc.). For example, the pitch of the fourth pixel repeating units Q4 in the first direction X may be equal to the pitch of the second pixel repeating units Q2 in the first direction X, and the pitch of the fourth pixel repeating units Q4 in the second direction Y may be equal to the pitch of the second pixel repeating units Q2 in the second direction Y, that is, the pitch of the fourth pixel repeating units Q4 in the first direction X may also be a1, and the pitch of the fourth pixel repeating units Q4 in the second direction Y may also be b1. It should be noted that, in some other examples, the fourth pixel repeating units Q4 may also be unevenly arranged in the second display region 20, which is not limited by the embodiments of the present disclosure.

For example, as shown in FIG. 4, the third pixel repeating units Q3 in the third display region 30 are evenly arranged, such that the third display region 30 may realize uniform light emission and display. For example, as shown in FIG. 4, the pitch of the third pixel repeating units Q3 in the first direction X is a2, and the pitch of the third pixel repeating units Q3 in the second direction Y is b2.

For example, a1=m*a2, m is a positive integer and m≥2; b1=n*b2, n is a positive integer and n≥2. In this case, the third display region 30 has a higher resolution, while the first display region 10 and the second display region 20 have a lower resolution. For example, as shown in the figure, compared with the third display region 30, a number of pixel repeating units (shown as the gray boxes) are reduced in the first display region 10 and the second display region 20. FIG. 4 merely illustrates the case wherein m=3 and n=3, but the embodiments of the present disclosure is not limited thereto.

For example, as shown in FIG. 4, the body parts of the transparent connection lines TL are substantially parallel to the first direction X, so as to be used for electrically connecting the first light-emitting elements (located in the first pixel repeating units Q1 in the first display region 10) and the first pixel circuits (located in the fourth pixel repeating units Q4 in the second display region 20) in the same row along the first direction X. For example, when the transparent connection wires TL are densely arranged, the pitch of the body parts of the transparent connection wires TL in the second direction Y is D, that is, the pitch of the transparent connection wires TL in the second direction Y is D, for example, the value of D generally ranges from 3 μm to 5 μm, but the embodiments of the present disclosure are not limited thereto.

For example, in the display substrate provided by the embodiments of the present disclosure, the maximum number s of the first pixel repeating units Q1 included in the first display region 10 in the first direction X satisfies:

$$s \leq 2*\text{Floor}(b1/((D*t))),$$

wherein, Floor Q represents the round down function. As such, in the cases that b1, D and t may be pre-determined according to the design scheme, the allowable dimension of the first display region 10 in the display substrate may be determined based on the above formula. For example, in some embodiments, the number of the first pixel repeating units Q1 included in the first display region 10 in the first direction X is 2*Floor(b1/(D*t)), such that the dimension of the first display region 10 in the first direction X is the maximum value that is allowed. In this case, the following circular display region 10A may have the largest area.

For example, the dimension L1 of the first display region 10 in the first direction X substantially satisfies: L1=s*a1. As such, the maximum value of the dimension L1 of the first display region 10 in the first direction X is approximately:

$$L1_{max}=2*\text{Floor}(b1/((D*t)))*a1.$$

For example, the dimension of the first display region 10 in the second direction Y is substantially equal to the dimension L1 of the first display region 10 in the first direction X, that is, the shape of the first display region 10 is substantially square, such that the region of the first display region 10 is not too large, while the circular display region 10A has an area as large as possible.

For example, as shown in FIG. 4, the first pixel repeating units Q1 in the first display region 10 may be controlled in a left-right half-and-half control manner, and may be respectively controlled by the fourth pixel repeating units Q4 in the second display region 20 that is axisymmetric with respect to the centerline of the first display region 10 in the second direction Y. For example, as shown in FIG. 4, the first pixel repeating units Q1 in the left half region of the first display region 10 are controlled by the fourth pixel repeating units Q4 in the second display region 20 on the left side of the first display region 10, and the first pixel repeating units Q1 in the right half region of the first display region 10 are controlled by the fourth pixel repeating units Q4 in the second display region 20 on the right side of the first display region 10. For example, as shown in FIG. 4, the first display region 10 includes a circular display region 10A (designated by a gray circle) and a ring-shaped wire region 10B surrounding the circular display region 10A. For example, as shown in FIG. 4, the wires for driving the first light-emitting elements in the circular display region 10A are arranged in a dense arrangement in the ring-shaped wire region 10B, such that the circular display region 10A may have an area as large as possible.

Figure 5A:
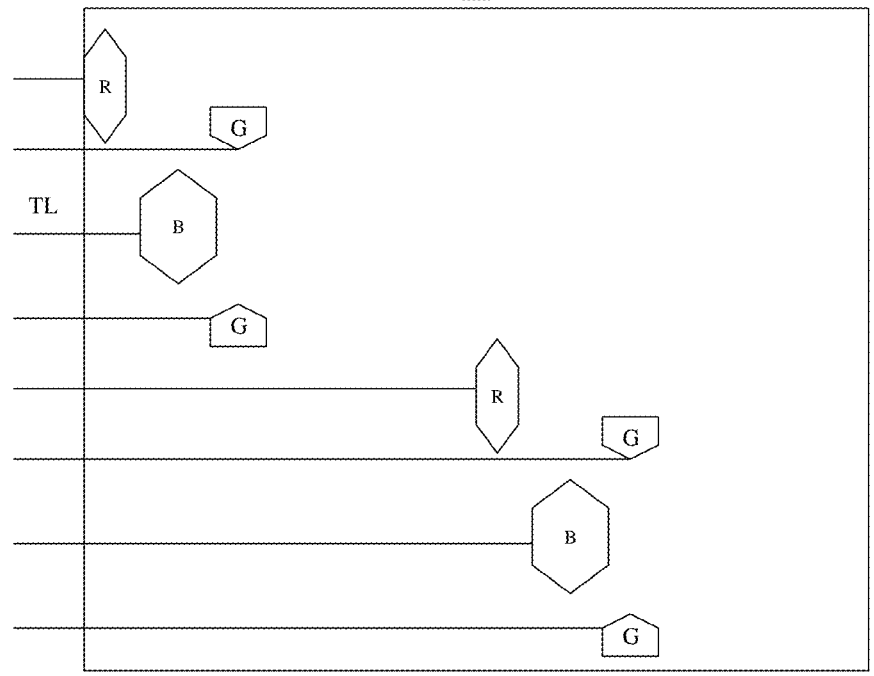
FIG. 5A is a schematic plan view of a first pixel repeating unit provided by at least one embodiment of the present disclosure.

FIG. 5A is a schematic plan view of a first pixel repeating unit provided by at least one embodiment of the present disclosure. For example, as shown in FIG. 5A, each first pixel repeating unit 01 includes eight first light-emitting elements arranged according to the GGRB pixel arrangement, accordingly, each fourth pixel repeating unit includes eight first pixel circuits for correspondingly driving the above-described eight first light-emitting elements. Each first light-emitting element is connected to one first pixel circuit through one transparent connection wire TL, as such, t=8.

For example, as shown in FIG. 5A, each first pixel repeating unit 01 includes two sets of first light-emitting elements, and each set of the first light-emitting elements includes a red light-emitting element R, two green light-emitting elements G and a blue light-emitting element B. For example, in each set of first light-emitting elements, the red light-emitting element R and a first green light-emitting element G may share one gating line, and the blue light-emitting element B and the other green light-emitting element G may also share one gating line. Therefore, the number of the gating lines corresponding to the first pixel repeating unit 01 shown in FIG. 5A is x=4; for example, in each set of the first light-emitting elements, the red light-emitting element R and the blue light-emitting element B may share one data line, and the two green light-emitting elements G may also share one data line, as such, the number of the data lines corresponding to the first pixel repeating unit 01 shown in FIG. 5A is y=4.

Figure 5B:
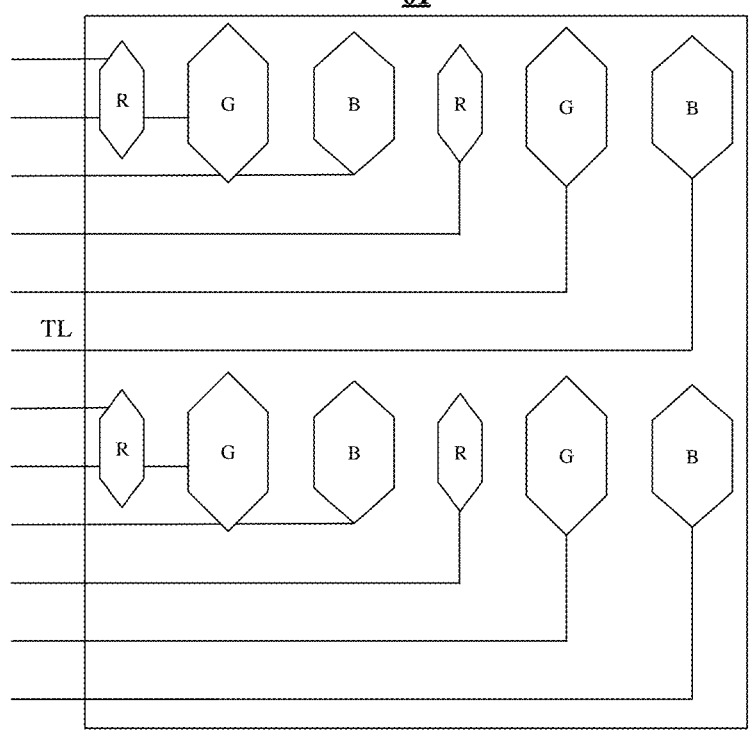
FIG. 5B is a schematic plan view of another first pixel repeating unit provided by at least one embodiment of the present disclosure.

FIG. 5B is a schematic plan view of another first pixel repeating unit provided by at least one embodiment of the present disclosure. For example, as shown in FIG. 5B, each first pixel repeating unit 01 includes twelve first light-emitting elements that are arranged according to RGB pixel arrangement, accordingly, each fourth pixel repeating unit includes twelve first pixel circuits for correspondingly driving the above-described twelve first light-emitting elements. Each first light-emitting element is connected to one first pixel circuit through one transparent connection wire TL, as such, t=12.

For example, as shown in FIG. 5B, the twelve first light-emitting elements in each first pixel repeating unit 01 include four red light-emitting elements R, four green light-emitting elements G, and four blue light-emitting elements B. For example, as shown in FIG. 5B, the twelve first light-emitting elements in each first pixel repeating unit 01 are arranged in two rows and six columns. For example, the six first light-emitting elements in each row may share one gating line, as such, the number of the gating lines corresponding to the first pixel repeating unit 01 shown in FIG. 5B is x=2; for example, two first light-emitting elements in each column may share one data line, as such, the number of the data lines corresponding to the first pixel repeating unit 01 shown in FIG. 5B is y=6.

It should be noted that, the first pixel repeating units shown in FIG. 5A and FIG. 5B are for illustration, and the specific structure of the first pixel repeating unit (i.e. the types and the number and the arrangement of the first light-emitting elements included in the first pixel repeating unit, etc.) is not limited by the embodiments of the present disclosure.

For example, the first pixel circuit in the fourth pixel repeating unit may adopt a common pixel driving circuit, such as 2T1C, 4T1C, 4T2C, 7T1C, or the like, but the present disclosure is not limited thereto. The specific structure of the first pixel circuit is not limited by the embodiments of the present disclosure.

It should be noted that, the specific structure of the second pixel repeating unit (i.e. the specific structure of the second pixel circuit, the types, the number and the arrangement of the second light-emitting elements, etc.) is not limited by the embodiments of the present disclosure, also, the specific structure of the third pixel repeating unit (i.e. the specific structure of the third pixel circuit, the types, the number and the arrangement of the third light-emitting elements, etc.) is not limited by the embodiments of the present disclosure. It should also be noted that, in order to simplify the design and facilitate the fabrication, the types, the number and the arrangement of the first light-emitting elements in the first pixel repeating unit may be the same as those of the second light-emitting elements in the second pixel repeating unit and the third light-emitting elements in the third pixel repeating unit, the specific structure of the first pixel circuit in the fourth pixel repeating unit may be the same as those of the second pixel circuit in the second pixel repeating unit and the third pixel circuit in the third pixel repeating unit.

For example, as shown in FIG. 4, the gating lines GL for driving the first light-emitting elements in each row of the first pixel repeating units Q1 in the first direction X are electrically connected to the corresponding first pixel circuits in the same row of the fourth pixel repeating units Q4 in the first direction X, at least a portion of the gating line GL extends along the first direction X, and at least another portion of the gating line GL is located in the ring-shaped wire region, the gating line GL does not extend through the circular display region 10A. Through disposing at least another portion of the gating line GL in the ring-shaped wire region, the gating line GL bypasses the circular display region 10A, which may improve the light transmittance of the circular display region 10A. For example, the above-described gating line GL may also be electrically connected to the second pixel circuit in the second pixel repeating unit and the third pixel circuit in the third pixel repeating unit that are disposed in the same row in the first direction X. For example, the above-described gating line GL is used for providing a driving control signal for the respective pixel circuit (e.g., the first pixel circuit to the third pixel circuit), for example, the driving control signal includes, but is not limited to, a reset control signal, a scanning signal, a light-emitting control signal, etc., accordingly, the gating line GL may include, but is not limited to, a reset control line, a scanning signal line (commonly referred to as a "gate line"), a light-emitting control line, etc.

For example, the data line DL for driving the first light-emitting elements in each column of the first pixel repeating units Q1 in the second direction Y is electrically connected to the first pixel circuits in a corresponding column of the fourth pixel repeating units Q4 in the second direction Y, at least a portion of the data line DL extends along the second direction Y, and at least another portion of the data line DL is located in the ring-shaped wire region 10B, the data line DL does not extend through the circular display region 10A. Through disposing at least another portion of the data line DL in the ring-shaped wire region, the data line DL bypasses the circular display region 10A, which may improve the light transmittance of the circular display region 10A. For example, the above-described data line DL may also be electrically connected to the third pixel circuits in the third pixel repeating units that are disposed in the same column as the each column of the first pixel repeating units Q1 in the second direction Y; as another example, in some examples, the second display region 20 completely surrounds the first display region 10. In this case, the above-described data line DL may also be electrically connected to the second pixel circuits in the second pixel repeating units that are disposed in the same column as the each column of first pixel repeating units Q1 in the second direction Y. For example, the above-described data line DL is used for providing a data signal for the respective pixel circuit (e.g., the first pixel circuit to the third pixel circuit), thereby controlling the luminous brightness of the respective light-emitting element (e.g., the first to the third light-emitting elements).

For example, in the display substrate provided by the embodiments of the present disclosure, the gating lines GL and the data lines DL may be located in different layers.

For example, in some embodiments, the number of the gating lines corresponding to each third pixel repeating unit Q3 is the same as the number of the gating lines corresponding to each first pixel repeating unit Q1, and the number of the gating lines GL corresponding to each first pixel repeating unit Q1 is x; the pitch of the gating lines GL is $c_1$ when the gating lines GL are densely arranged in the ring-shaped wire region 10B, for example, the value of $c_1$ may generally be about 3 μm; the total radial width R1 of the gating lines GL in the ring-shaped wire region 10B is approximately $x*c_1*Floor(L_1/b_2)/2$, wherein $Floor(L_1/b_2)$ represents the maximum quantity of the third pixel repeating units Q3 corresponding to the dimension of the first display region 10 in the second direction Y. It should be noted that, as shown in FIG. 4, in terms of the gating lines GL that need to bypass (i.e. not extend through) the circular display region 10A in the first display region 10, half of the gating lines GL may route around the upper half ring of the circular wire region 10B to bypass the circular display region 10A, while the other half of the gating lines GL may rout around the lower half ring of the circular wire region 10B to bypass the circular display region 10A.

For example, in some embodiments, the number of the data lines DL corresponding to each first pixel repeating unit Q1 is y; the pitch of the date lines DL is $c_2$ when the data lines DL are densely arranged in the ring-shaped wire region 10B, for example, the value of $c_2$ may generally be about 4 μm; since the first pixel repeating units Q1 in the first display region 10 adopt left-right half-and-half control manner, the total radial width R2 of the data lines DL in the ring-shaped wire region 10B is approximately $y*c_2*s/2$. It should be noted that, as shown in FIG. 4, in terms of the data lines DL corresponding to the first display region 10, half of the data lines DL may route around the left half ring of the circular wire region 10B to bypass the circular display region 10A, and finally be electrically connected to the first pixel circuits in the second display region 20 on the left side of the first display region 10, while the other half of the data lines DL may route around the right half ring of the circular wire region 10B to bypass the circular display region 10A, and finally be electrically connected to the first pixel circuits in the second display region 20 on the right side of the first display region 10.

For example, in some embodiments, as shown in FIG. 4, the orthogonal projection of the body part of the gating line GL (extending along circumference in the ring-shaped wire region 10B) on the display substrate is not overlapped with the orthogonal projection of the body part of the data line DL (extending along circumference in the circular wire region 10B) on the display substrate, such that the parasitic capacitance may be reduced. In this case, the radial width R of the circular wire region 10B is approximately $x*c_1*Floor(L_1/b_2)/2+y*c_2*s/2$, and the diameter of the circular display region 10A is approximately $s*a_1-x*c_1*Floor(L_1/b_2)-y*c_2*s/2$; the diameter of the above-described circular display region 10A is the allowable maximum diameter of the circular display region 10A in this case.

For example, in some other embodiments, the orthogonal projection of the body part of the gating line GL (extending along circumference in the ring-shaped wire region 10B) on the display substrate is at least partially overlapped with the orthogonal projection of the body part of the data line DL (extending along circumference in the circular wire region 10B) on the display substrate. In this case, the radial width R of the circular wire region 10B is approximately $\max(x*c_1*Floor(L_1/b_2)/2, y*c_2*s/2)$, and the diameter of the circular display region 10A is approximately $s*a_1-\max(x*c_1*Floor(L_1/b_2), y*c_2*s)$; the diameter of the above-described circular display region 10A is the allowable maximum diameter of the circular display region 10A in this case.

For example, in some embodiments, in order to simplify the design and facilitate the fabrication, it may be designed as $a_1=b_1$, as such, under the circumstance that the orthogonal projection of the body part of the gating line GL (extending along circumference in the ring-shaped wire region 10B) on the display substrate is not overlapped with the orthogonal projection of the body part of the data line DL (extending along circumference in the circular wire region 10B) on the display substrate, the radial width R of the ring-shaped wire region 10B is approximately $(x*c_1*n+y*c_2)*s/2$, and the diameter of the circular display region 10A is approximately $(a_1-x*c_1*n-y*c_2)*s$; under the circumstance that the orthogonal projection of the body part of the gating line GL (extending along circumference in the ring-shaped wire region 10B) on the display substrate is at least partially overlapped with the orthogonal projection of the body part of the data line DL (extending along circumference in the circular wire region 10B) on the display substrate, the radial width R of the ring-shaped wire region 10B is approximately max(x*c1*n, y*c2)*s/2, and the diameter of the circular display region 10A is approximately (a1−max(x*c1*n, y*c2))*s.

For example, in some embodiments, the dimension L2 of the second display region 20 in the first direction X substantially satisfies: L2=(s+2)*a1. For example, as shown in FIG. 4, the number of columns of the second pixel repeating units Q2 in the second display region 20 is two columns more than the number of columns of the first pixel repeating units Q1 in the first display region 10, the extra two columns of the second pixel repeating units Q2 are respectively located in the second display regions 20 on the left and the right sides of the first display region 10, and are away from the first display region 10. For example, considering the difference between the boundary luminescence algorithms of the third display region 30 (having high resolution) and the second display region 20 (having low resolution), the extra two columns of the second pixel repeating units Q2 may be used for compensating the impact of the above-described difference. For example, as shown in FIG. 4, the number of the columns of the fourth pixel repeating units Q4 in the second display region 20 is two columns more than the number of the columns of the first pixel repeating units Q1 in the first display region 10, and the extra two columns of the fourth pixel repeating units Q4 are respectively located in the second display regions 20 on the left and the right sides of the first display region 10, and are away from the first display region 10. For example, the extra two columns of the fourth pixel repeating units Q4 may be used as backup.

For example, in some embodiments, as shown in FIG. 3 and FIG. 4, the dimension of the second display region 20 in the second direction Y is substantially equal to the dimension of the first display region 10 in the second direction 20. For example, in some other embodiments, the dimension of the second display region 20 in the second direction Y may be slightly larger than the dimension of the first display region 10 in the second direction Y, in this case, the second display region 20 may completely surround the first display region 10. For example, the difference between the dimension of the second display region 20 in the second direction Y and the dimension of the first display region 10 in the second direction Y is substantially equal to 4b1, that is, there are two rows of second pixel repeating units Q2 respectively located on the upper side and the lower side of the first display region 10, which is included in the embodiments of the present disclosure, but the embodiments of the present disclosure is not limited thereto. In view of above, the display substrate provided by the embodiments of the present disclosure may reasonably determine the dimensions and sizes of the first display region 10 and the second display region 20 on the premise that the area of the circular display region 10A is as large as possible. In the actual application, the region of the first display region 10 outside the ring-shaped wire region 10B may be designed and fabricated to be consistent with the second display region 20, in this case, the circular display region 10A may serve as the only light-transmitting display region. That is, the circular display region 10A in the embodiment of FIG. 4 may be regarded as an effective first display region, while the first display region outside the circular display region 10A in the embodiment of FIG. 4 may be regarded as a portion of the second display region.

For example, in some embodiments, the partial cross-sectional structure view of the display substrate provided by the embodiments of the present disclosure may be illustrated with reference to FIG. 2. For example, the structures of the light-emitting elements (e.g., the first to third light-emitting elements) in the display substrate provided by the embodiments of the present disclosure may refer to the light-emitting element 4 in FIG. 2. For example, in the display substrate provided by the embodiments of the present disclosure, each light-emitting element includes an anode, a cathode and a light-emitting layer disposed between the anode and the cathode. For example, in some examples, the anode may include a three-layer structure including ITO/Ag/ITO and the like, and the specific structure of the anode is not limited by the embodiments of the present disclosure. For example, the cathode may be formed as a whole surface of common cathode, for example, the material of the common cathode may include metal materials, such as lithium (Li), aluminum (Al), magnesium (Mg), silver (Ag), or the like. For example, since the common cathode may be formed as a very thin layer, the common cathode has a good light transmittance.

For example, the display substrate provided by the embodiments of the present disclosure may be an organic light-emitting diode (OLED) display substrate or a quantum dot light-emitting diode (QLED) display substrate, or the like, and the specific type of the display substrate is not limited by the embodiments of the present disclosure.

For example, under the circumstance that the display substrate is an organic light-emitting diode display substrate, the light-emitting layer may include a small molecular organic material or a polymer molecular organic material, and may be a fluorescent light-emitting material or a phosphorescent light-emitting material, which may emit red light, green light, blue light, or white light, etc. Moreover, according to different actual requirements, in different examples, the light-emitting layer may further include functional layer(s) such as an electron injection layer, an electron transport layer, a hole injection layer, a hole transport layer, etc.

For example, under the circumstance that the display substrate is a quantum dot light-emitting diode (QLED) display substrate, the light-emitting layer may include quantum dots materials, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or the like, and the grain size of the quantum dot is, for example, 2-20 nm.

For example, the structure of the pixel circuit (e.g., the first to third pixel circuits) in the display substrate provided by the embodiments of the present disclosure may refer to the pixel circuit 5 in FIG. 2. For example, in the display substrate provided by the embodiments of the present disclosure, each pixel circuit includes structures such as a thin film transistor (T), a capacitor (C), and the like. For example, a thin film transistor includes an active layer, a gate, and source/drain electrodes (source and drain, shown as the source/drain electrodes 7 in FIG. 2).

For example, in some embodiments, referring to FIG. 2, the display substrate may include an anode layer, a source/drain electrode layer, and a transparent connection wire layer disposed between the anode layer and the source/drain electrode layer; the anode of the first light-emitting element (shown as the anode 4A in FIG. 2) is located in the anode layer, the transparent connection wire (shown as the wire 6 in FIG. 2) is located in the transparent connection wire layer, and at least one of the source and drain of the thin film transistor (shown as the source/drain electrode 7 in FIG. 2) is located in the source/drain metal layer, and the anode of the first light-emitting element is electrically connected to at least one of the source and the drain of the thin film transistor through a transparent connection wire. It should be understood that, insulating layers are generally disposed between the anode layer and the transparent connection wire layer, and between the source/drain electrode layer and the transparent connection wire layer, and a via for electrical connection is commonly disposed in the insulating layer.

For example, in some embodiments, in order to improve the light transmittance of the first display region, the anode of the first light-emitting element may be a transparent electrode, and the anode of the first light-emitting element is electrically connected to the first pixel circuit in the second display region through a transparent connection wire. It should be noted that, in the embodiments of the present disclosure, only the portion of the transparent connection wire located in the light-transmitting display region 1 is required to be transparent; for example, the transparent connection wire may use a transparent conductive material (such as a transparent metal oxide (e.g., indium tin oxide (ITO), etc.)) to have a good light transmittance.

The display substrate provided by the embodiments of the present disclosure may optimize the layout of the transparent connection wires and the layout of the first light-emitting elements in the first display region, thereby improving the display effect of the first display region, as well as improving the light transmittance of the first display region, which is helpful to improve the performance of the full screen display device.

Figure 6:
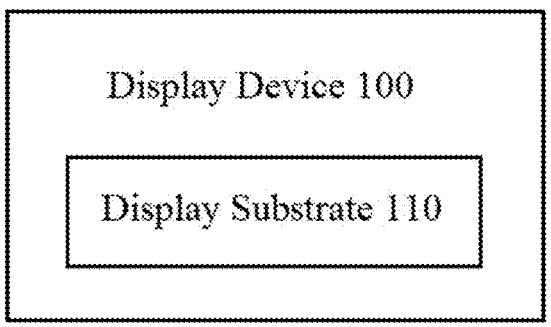
FIG. 6 is a schematic block diagram of a display device provided by at least one embodiment of the present disclosure.

At least one embodiment of the present disclosure also provides a display device. FIG. 6 is a schematic block diagram of a display device provided by at least one embodiment of the present disclosure. For example, as shown in FIG. 6, the display device 100 includes a display substrate 110, which is a display substrate provided by any embodiment of the present disclosure, such as the display substrate shown in FIG. 3 or FIG. 4. The display device 100 may be any electronic device with display function, such as smart phone, laptop, tablet, television, or the like. For example, when the display device 100 is a smartphone or a tablet, the smartphone or the tablet may have a full screen design, that is, there is free of periphery region surrounding the third display region 30. Moreover, the smartphone or tablet also has under-display sensors (e.g., cameras, infrared sensors, etc.), which may perform operations such as image shooting, distance sensing, light intensity sensing and the like.

It should be noted that, the display substrate 110 and other components (e.g., image data encoding/decoding device, clock circuit, etc.) of the display device 100 may use any applicable components, which should be understood by those skilled in the art, and are not described again here, nor should it be regarded as a limitation to the embodiments of the present disclosure.

Figure 7:
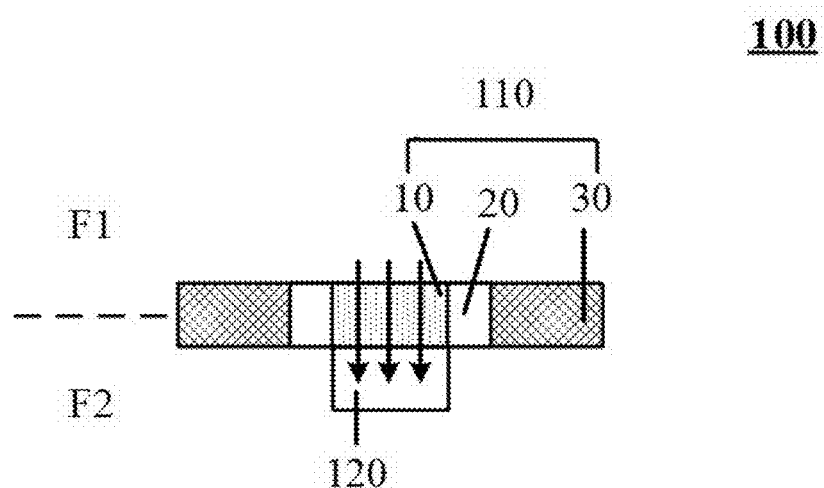
FIG. 7 is a schematic cross-sectional view of a display device provided by at least one embodiment of the present disclosure.

FIG. 7 is a schematic cross-sectional view of a display device provided by at least one embodiment of the present disclosure. For example, as shown in FIG. 7, the display device 100 includes a display substrate 110, which is a display substrate provided by any embodiment of the present disclosure, such as the display substrate shown in FIG. 3 or FIG. 4. For example, the display device 100 also includes a sensor 120.

For example, as shown in FIG. 7, the display substrate 110 includes a first side F1 for display and a second side F2 opposite to the first side F1. That is, the first side F1 is the display side, and the second side F2 is the non-display side. The display substrate 110 is configured as performing a display operation on the first side F1, that is, the first side F1 of the display substrate 110 is the light-emitting side of the display substrate 110, and the first side F1 faces the user. The first side F1 and the second side F2 are oppositely arranged in the normal direction of the display surface of the display substrate 110.

For example, as shown in FIG. 7, the sensor 120 is disposed on the second side F2 of the display substrate 110, and the sensor 120 is configured for receiving the light from the first side F1. For example, the sensor 120 and the first display region 10 are overlapped in the normal direction of the display surface of the display substrate 110 (e.g., the direction perpendicular to the display substrate 110), the sensor 120 may receive and process the optical signal passing through the first display region 10, the optical signal may be visible light, infrared light, etc. For example, the first display region 10 allows the light from the first side F1 to be at least partially transmitted to the second side F2. For example, there is free of pixel circuit disposed in the first display region 10, in this case, the light transmittance of the first display region 11 may be enhanced. For example, in some examples, the sensor 120 and the circular display region 10A in the first display region 10 are overlapped in the normal direction of the display surface of the display substrate 110 (e.g., the direction perpendicular to the display substrate 110). In this case, the circular display region 10A may be regarded as an effective first display region.

For example, the orthogonal projection of the sensor 120 on the display substrate is at least partially overlapped with the first display region 10. For example, in some examples, when adopting directly underlying configuration, the orthogonal projection of the sensor 120 on the display substrate 110 is located within the first display region 10. For example, in some other examples, when other light guide elements (such as light guide plate, light guide tube, etc.) are used such that the light is incident on the sensor 320 from the side surface, the orthogonal projection of the sensor 120 on the display substrate 110 is partially overlapped with the first display region 10. At this time, since the light may laterally propagate to the sensor 120, the sensor 120 is not necessary to be completely located at the position corresponding to the first display region 10.

For example, through disposing the first pixel circuits in the second display region 20 and making the sensor 120 and the first display region 10 overlap in the normal direction of the display surface of the display substrate 110, the occlusion of the elements in the first display region 10 to the optical signal incident on the first display region 10 and irradiated on the sensor 120 may be reduced, which may improve the signal-to-noise ratio of the image output by the sensor 120. For example, the first display region 10 may be referred to as a high light transmittance region of the low resolution region of the display substrate 110 (the second display region 20 may be referred to as a low light transmittance region or an opaque region of the low resolution region of the display substrate 110).

For example, the sensor 120 may be an image sensor, which may be used for collecting an image of the external environment that faces the light-collecting surface of the sensor 120, the image sensor may be, for example, a CMOS image sensor or a CCD image sensor. The sensor 120 may also be an infrared sensor, a distance sensor, or the like. For example, under the circumstance that the display device 100 is a mobile terminal such as a mobile phone, a notebook, or the like, the sensor 120 may be implemented as a camera of a mobile terminal such as a mobile phone or a notebook, and may also include optical device(s) such as a lens, a mirror or an optical waveguide according to requirement, so as to modulate the light path. For example, the sensor 120 may also include photosensitive pixels arranged in an array. For example, each photosensitive pixel may include a photodetector (e.g., photodiode, phototransistor) and a switching transistor (e.g., thin film transistor). For example, the photodiode may transfer the optical signals irradiated thereon into electrical signals, and the switching transistor may be electrically connected to the photodiode, so as to control whether the photodiode is in the state of collecting optical signals and the time of collecting optical signals.

In some examples, in the first display region 10, only the anode of the first light-emitting element may be opaque, that is, the wire for driving the first light-emitting element bypasses the first display region 10 or is disposed as a transparent wire. In this case, not only the light transmittance of the first display region 10 may be further improved, but also the diffraction caused by the respective element in the first display region 10 may be reduced. For example, in some other examples, the anode of the first light-emitting element may also be further disposed as a transparent electrode.

It should be noted that, in the embodiments of the present disclosure, the display device 100 may also include more components and structures, which are not limited by the embodiments of the present disclosure. The technical effect and detailed description of the display device 100 may refer to the description of the display substrate described above, which are not described again here.

For the disclosure, the following points should be noted:

(1) Only the structures relevant to the embodiments of the disclosure are involved in the accompanying drawings of the embodiments of the disclosure, and other structures may refer to the conventional design.

(2) For clarity, the thickness of layers or structures in the accompanying drawings of the embodiments of the disclosure is enlarged. It should be understood that when an element such as a layer, a film, an area or a substrate is referred to be disposed "on" or "beneath" another element, the element may be "directly" disposed "on" or "beneath" another element, or an intermediate element may be provided therebetween.

(3) The embodiments of the disclosure and the features in the embodiments may be mutually combined to be obtain new embodiment without conflict.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The foregoing is merely exemplary embodiments of the disclosure, but is not used to limit the protection scope of the disclosure. The protection scope of the disclosure shall be defined by protection scope of the attached claims.

The invention claimed is:

1. A display substrate, having a first side for display and a second side opposite to the first side, and comprising a first display region, a second display region and a third display region; wherein, the first display region comprises a plurality of first pixel repeating units arranged in an array along a first direction and a second direction, each of the plurality of first pixel repeating units comprises a first light-emitting element, and the first display region comprises a light-transmitting region that allows a light to be transmitted between the first side and the second side of the display substrate;

the second display region comprises a plurality of second pixel repeating units and a plurality of fourth pixel repeating units that are arranged as an array along the first direction and the second direction, each of the plurality of second pixel repeating units comprises a second pixel circuit and a second light-emitting element, the second pixel circuit is electrically connected to the second light-emitting element, and each of the fourth pixel repeating units comprises a first pixel circuit;

the third display region comprises a plurality of third pixel repeating units arranged as an array along the first direction and the second direction, each of the plurality of third pixel repeating units comprises a third pixel circuit and a third light-emitting element, and the third pixel circuit is electrically connected to the third light-emitting element;

the third display region at least partially surrounds the second display region, the second display region at least partially surrounds the first display region, and the second display region is axisymmetric with respect to a centerline of the first display region in the second direction;

each of the plurality of first pixel repeating units corresponds to one of the plurality of fourth pixel repeating units, and a connection line of centers of each of the plurality of first pixel repeating units and a corresponding one of the plurality of fourth pixel repeating units is substantially parallel to the first direction, the first light-emitting element in each of the plurality of first pixel repeating units is electrically connected to the first pixel circuit in the corresponding one of the plurality of the fourth pixel repeating units through a transparent connection wire, a number of the transparent connection wire is t, t is a positive integer and t≥1;

a pitch of the plurality of first pixel repeating units in the second direction is b1, a pitch of the plurality of second pixel repeating units in the second direction is b1, and a pitch of the plurality of third pixel repeating units in the second direction is b2, wherein, b1=n*b2, n is a positive integer and n≥2;

wherein a pitch of the transparent connection wire in the second direction is D, and a maximum number s of the plurality of first pixel repeating units included in the first display region in the first direction satisfies:

s≤2*Floor (b1/((D*t))), where Floor ( ) represents a round down function.

2. The display substrate according to claim 1, wherein, a pitch of the plurality of first pixel repeating units in the first direction is a1, a pitch of the plurality of second pixel repeating units in the first direction is a1, and a pitch of the plurality of third pixel repeating units in the first direction is a2, wherein a1=m*a2, m is a positive integer and m≥2, a dimension L1 of the first display region in the first direction substantially satisfies: L1=s*a1.

3. The display substrate according to claim 2, wherein a dimension of the first display region in the second direction is substantially equal to the dimension of the first display region in the first direction.

4. The display substrate according to claim 3, wherein the first display region comprises a circular display region and a ring-shaped wire region surrounding the circular display region;

a gating line for driving the first light emitting element in each row of the plurality of first pixel repeating units in the first direction is electrically connected to the first pixel circuit in a corresponding same row of the plurality of fourth pixel repeating units in the first direction, and at least a portion of the gating line extends along the first direction, at least another portion of the gating line is located in the ring-shaped wire region, and the gating line does not extend through the circular display region;

a data line for driving the first light-emitting element in each column of the plurality of first pixel repeating units in the second direction is electrically connected to the first pixel circuit in a corresponding column of the plurality of fourth pixel repeating units in the second direction, and at least a portion of the data line extends along the second direction, at least another portion of the data line is located within the ring-shaped wire region, the data line does not extend through the circular display region;

the gating line and the data line are located in different layers.

5. The display substrate according to claim 4, wherein,
a number of a gating line corresponding to each of the plurality of third pixel repeating units is the same as a number of the gating line corresponding to each of the plurality of first pixel repeating units, the number of the gating line corresponding to each of the plurality of first pixel repeating units is x, and a pitch of the gating line in the ring-shaped wire region is c1, a total radial width of the gating line in the ring-shaped wire region is approximately $x*c1*\text{Floor}(L1/b2)/2$;

a number of the data line corresponding to each of the plurality of first pixel repeating units is y, a pitch of the data line in the ring-shaped wire region is c2, and a total radial width of the data line in the ring-shaped wire region is approximately $y*c2*s/2$.

6. The display substrate according to claim 5, wherein an orthogonal projection of a body part of the gating line on the display substrate is not overlapped with an orthogonal projection of a body part of the data line on the display substrate, wherein the body part of the gating line extends along circumference in the ring-shaped wire region, and the body part of the data line extends along circumference in the ring-shaped wire region,
a radial width of the ring-shaped wire region is approximately $x*c1*\text{Floor}(L1/b2)/2+y*c2*s/2$.

7. The display substrate according to claim 6, wherein a diameter of the circular display region is approximately $s*a1-x*c1*\text{Floor}(L1/b2)-y*c2*s/2$.

8. The display substrate according to claim 5, wherein an orthogonal projection of a body part of the gating line on the display substrate is at least partially overlapped with an orthogonal projection of a body part of the data line on the display substrate, wherein the body part of the gating line extends along circumference in the ring-shaped wire region, and the body part of the data line extends along circumference in the ring-shaped wire region,
a radial width of the ring-shaped wire region is approximately $\max(x*c1*\text{Floor}(L1/b2)/2, y*c2*s/2)$, wherein max ( ) is a function taking a maximum value.

9. The display substrate according to claim 8, wherein a diameter of the circular display region is approximately $s*a1-\max(x*c1*\text{Floor}(L1/b2), y*c2*s)$.

10. The display substrate according to claim 1, wherein a dimension L2 of the second display region in the first direction substantially satisfies: $L2=(s+2)*a1$.

11. The display substrate according to claim 1, wherein a dimension of the second display region in the second direction is substantially equal to a dimension of the first display region in the second direction.

12. The display substrate according to claim 1, wherein a dimension of the second display region in the second direction is greater than a dimension of the first display region in the second direction, and a difference between the dimension of the second display region in the second direction and the dimension of the first display region in the second direction is substantially equal to 4b1.

13. The display substrate according to claim 1, wherein a pitch of the plurality of fourth pixel repeating units in the first direction is equal to a pitch of the plurality of second pixel repeating units in the first direction.

14. The display substrate according to claim 1, wherein each of the plurality of first pixel repeating units comprises eight first light-emitting elements arranged according to a GGRB pixel arrangement, t=8, a number of gating lines corresponding to each of the plurality of first pixel repeating units is 4, and a number of data lines corresponding to each of the plurality of first pixel repeating units is 4.

15. The display substrate according to claim 1, wherein each of the plurality of first pixel repeating units comprises twelve first light-emitting elements arranged according to a RGB pixel arrangement, t=12, a number of gating lines corresponding to each of the plurality of first pixel repeating units is 2, and a number of data lines corresponding to each of the plurality of first pixel repeating units is 6.

16. The display substrate according to claim 1, wherein the first direction and the second direction are perpendicular to each other.

17. The display substrate according to claim 1, wherein the display substrate comprises an anode layer, a source/drain electrode layer and a transparent connection wire layer between the anode layer and the source/drain electrode layer,
an anode of the first light-emitting element is located in the anode layer, and the transparent connection wire is located in the transparent connection wire layer,
the first pixel circuit comprises a thin film transistor, the thin film transistor comprises a source and a drain, and at least one of the source and the drain of the thin film transistor is located in the source/drain electrode layer,
the anode of the first light-emitting element is electrically connected to at least one of the source and the drain of the thin film transistor through the transparent connection wire.

18. The display substrate according to claim 1, wherein an anode of the first light-emitting element is a transparent electrode.

19. A display device, comprising a display substrate according to claim 1.

20. The display device of claim 19, further comprising a sensor, wherein the sensor is disposed on the second side of the display substrate, an orthogonal projection of the sensor on the display substrate is at least partially overlapped with the first display region, and the sensor is configured for receiving a light from the first side.

* * * * *